(12) United States Patent
Lambert

(10) Patent No.: US 6,746,710 B1
(45) Date of Patent: Jun. 8, 2004

(54) SCREEN PRINTING

(75) Inventor: Philip John Lambert, Weymouth (GB)

(73) Assignee: DEK International GmbH, Zurich (CH)

( * ) Notice: Subject to any disclaimer, the term of this patent is extended or adjusted under 35 U.S.C. 154(b) by 0 days.

(21) Appl. No.: 10/031,336

(22) PCT Filed: Jul. 19, 2000

(86) PCT No.: PCT/GB00/02781

§ 371 (c)(1), (2), (4) Date: Apr. 4, 2002

(87) PCT Pub. No.: WO01/05592

PCT Pub. Date: Jan. 25, 2001

(51) Int. Cl.[7] .................................................. B05D 1/32
(52) U.S. Cl. .......................... 427/96; 427/282; 427/288
(58) Field of Search ......................... 427/96, 282, 288; 101/129; 118/406, 410, 411, 415

(56) References Cited

U.S. PATENT DOCUMENTS

| 3,302,564 A |   | 2/1967  | Wilford          |
| 4,612,874 A | * | 9/1986  | Mitter           |
| 4,622,239 A |   | 11/1986 | Schoenthaler et al. |
| 5,824,155 A | * | 10/1998 | Ha et al.        |

FOREIGN PATENT DOCUMENTS

| FR | 2263109    |   | 10/1975 |
| GB | 1486977    |   | 9/1977  |
| WO | WO96/20088 |   | 7/1996  |
| WO | WO98/16387 |   | 4/1998  |
| WO | 98/16387   | * | 4/1998  |

* cited by examiner

Primary Examiner—Fred J. Parker
(74) Attorney, Agent, or Firm—Reed Smith

(57) ABSTRACT

A screen printing head for a method of applying a pasty product to a printing screen, the printing head comprising: a main body (30); wiper blades (31, 32) disposed to the main body for containing a printing screen (34); a first chamber (48) providing a reservoir for containing a supply of pasty product, the first chamber being defined at least in part by the main body and including at least one outlet opening (46) through which pasty product is in use forced under pressure; a second chamber (50) in fluid communication with the at least one outlet opening, the second chamber being defined in part by the main body and the wiper blades and being in use to communication with the printing screen; and a flow director (63) disposed in the second chamber and configured such as in use to cause a circulatory flow of pasty product contained therein which passes over the surface of the printing screen and a flow of pasty product towards the printing screen which acts to force pasty product of the circulatory flow towards the printing screen and into apertures therein.

13 Claims, 3 Drawing Sheets

SCREEN PRINTING

This Application claims priority to International Application PCT/GB00/02781 filed Jul. 19, 2000 and to United Kingdom Application 9916906.2 filed Jul. 19, 1999.

FIELD OF THE INVENTION

The present invention relates to screen printing and particularly to screen printing in which pasty product to be printed is contained within a screen printing head and delivered through the printing head by applied pressure.

BACKGROUND OF THE INVENTION

It is an established technique in the assembly of printed circuit boards to deposit solder paste where connections are to be made with components, place the components on the paste deposits, and then heat the assembly to re-flow the paste and complete the connections. Screen printing machines have been used to deposit solder paste onto printed circuit boards through the apertures of a stencil or screen.

Solder paste consists of metallic microspheres of solder joined by an organic material or flux. The metallic content of such solder paste typically makes up 50% of the volume, and up to 90% of the weight of the paste. The viscous flux consists of rheologic agents, adhesive agents and cleaning agents some of which are thixotropic and others of which are volatile solvents. The thixotropic property of the solder paste has the effect that relative movement of regions within the paste causes a process of shear thinning to locally reduce the viscosity of the paste.

A typical print will comprise a multiplicity of small blocks of solder paste, and for consistent quality it is essential that each block contains the same proportions of each constituent material. This requires a consistent homogeneous distribution of the materials within the solder paste.

In one traditional screen printing technique, as illustrated in FIG. 1, an inclined squeegee 1 is used to push a volume of a pasty product 2 over a stencil 3 which includes apertures 4 and is located above a circuit board 5, thereby filling the apertures 4 in the stencil 3 and providing a deposit on the circuit board 5. Forward movement of the squeegee with a horizontal force F1, causes a downward Force F2 to be applied to the pasty product 2. This downward force F2 forces the pasty product 2 into the apertures 4 in the stencil 3, and in conjunction with the adhesion of the pasty product 2 to the stencil 3 causes the pasty product 2 to roll across the stencil 3 as depicted by arrow 6, thereby shear thinning the pasty product 2.

There are many problems associated with this screen printing technique. One problem is that exposure of the pasty product 2 to the atmosphere results in evaporation of the solvents of the pasty product 2 and hence drying of the pasty product 2. Another problem is that increasing the speed of the squeegee 1 to increase the downward force F2 which forces the pasty product 2 into the apertures 4 of the stencil 3, not only reduces the time available to fill the apertures 4, but can also cause the pasty product 2 to slide across the stencil 3, thereby reducing the rolling effect and hence the shear thinning.

Screen printing heads have been proposed, for example as disclosed in U.S. Pat. No. 4,622,239, which enclose the pasty product to overcome the problems of evaporation, but these printing heads have not addressed the problem of setting a suitable print speed.

WO-A-96/20088 discloses a screen printing head which attempts to overcome both the problems of evaporation and the setting of the print speed by applying a pressure directly to the pasty product. However, this printing head does not provide for a rolling action of the pasty product and hence shear thinning of the same. Furthermore, this printing head requires a very high pressure to be applied to the pasty product. This high pressure can result in the separation of the metallic and flux components of solder pastes which results in inconsistent printing.

WO-A-98/16387 discloses a screen printing head which has been developed partially in response to the known problems of evaporation and the setting of the print speed. As illustrated in FIG. 2, this printing head comprises a main body 10, first and second wiper blades 11, 12, which contact a stencil 13 and together with the main body 10 define a chamber 15 containing a pasty product 16, a grille 17 located at the lower end of the main body 10, and a piston 18 for applying a downward force F2 on the pasty product 16. The stencil 13, which includes a plurality of apertures 19, is located above a circuit board 20 onto which deposits of the pasty product 16 are to be printed. In use, the printing head is moved in one of two opposite printing directions, with a horizontal force F1, which causes the wiper blades 11, 12, which are pressed against the stencil 13 by the force imparted on the pasty product 16 by the piston 18, to act to lift the pasty product 16 from the region above the stencil 13 and cause the pasty product 16 to pass upwardly through the grille 17, which pasty product 16 is subsequently forced back downwardly through the grille 17 by the action of the pressure developed by the piston 18. This rolling action of the pasty product 16, as depicted by arrows 21, shear thins the pasty product 16 and thereby enables the pressure F2 applied by the piston 18 to be maintained at a low level and also prevents separation of the components of the pasty product 16 by the mixing effect of the rolling action. Further, the pressure F2 applied to the pasty product 16 is independent of the speed of movement of the printing head.

Whilst this printing head provides for much improved screen printing, it has been established that in some circumstances this printing head does not provide for sufficient shear thinning of the pasty product 16 as necessary for a perfect print.

In the screen printing process, as illustrated in FIG. 3a, incomplete filling of the stencil apertures 19 can result where the pasty product 16 is not sufficiently thinned. Where the stencil apertures 19 are incompletely filled, the action of the trailing wiper blade 11 can shear the pasty product 16 over the stencil apertures 19, with the result that the pasty product 16 in the apertures 19 is pushed to one, the forward, end of the apertures 19, as illustrated in FIG. 3b, resulting in only a partial print. In an extreme case, the remaining pasty product 16 in the stencil apertures 19 may not be in sufficient contact with the circuit board 20 such that when the circuit board 20 and the stencil 13 are separated, the pasty product 16 is insufficiently adhered to the circuit board 20 and remains in the stencil 13, as shown in FIG. 3c, resulting in virtually no print at all. Furthermore, the retention of pasty product 16 in apertures 19 of the stencil 13 can itself lead to problems with subsequent prints since, as mentioned hereinabove, the pasty product 16 is prone to drying out and the drying out of pasty product 16 in the apertures 19 will give rise to printing problems. These problems have been made worse by recent trends in miniaturization which have led to the use of smaller stencil apertures 19, which miniaturization reduces the area of pasty product to circuit board contact relative to the area of pasty product to aperture wall contact.

SUMMARY OF THE INVENTION

Accordingly, the present invention provides a screen printing head for applying a pasty product to a printing screen, comprising: a main body; wiper blades disposed to the main body for contacting a printing screen; a first chamber providing a reservoir for containing a supply of pasty product, the first chamber being defined at least in part by the main body and including at least one outlet opening through which pasty product is in use forced under pressure; a second chamber in fluid communication with the at least one outlet opening, the second chamber being defined in part by the main body and the wiper blades and being in use in communication with the printing screen; and a flow director disposed in the second chamber and configured such as in use to cause a circulatory flow of pasty product contained therein which passes over the surface of the printing screen and a flow of pasty product towards the printing screen which acts to force pasty product of the circulatory flow towards the printing screen and into apertures therein.

Such a printing head provides for enhanced shear thinning of the pasty product filled into the apertures of the printing screen and hence improved stencil aperture filling to reduce the incidence of poor quality printing.

Preferably, the at least one outlet opening comprises an elongate slot.

Preferably, the flow director is further configured such as to define first and second circulation zones in which pasty product is locally circulated and through which the circulatory flow is directed.

Preferably, the flow director comprises vanes, with the circulatory flow in use passing beneath lower edges of the vanes.

More preferably, the flow director comprises first and second vanes disposed on opposed sides of the at least one outlet opening with the lower edges of the vanes defining a nozzle directed towards the printing screen.

Preferably, the nozzle is in elongate nozzle.

Preferably, the main body includes first and second lobe members which in part define the second chamber, the lobe members being disposed above respective ones of the wiper blades and having arcuate lower surfaces to promote the circulatory flow.

In one embodiment the main body includes one or more ports through which the first chamber can be charged with pasty product.

In another embodiment the main body includes a replaceable cassette which defines at least in part the first chamber, the first chamber being charged by replacement of the cassette.

Preferably, the wiper blades comprise flexible wiper blades.

The present invention also extends to a screen printing apparatus comprising the above-described printing head.

The present invention also provides a method of screen printing using a screen printing head including a chamber in communication with the printing screen, comprising the steps of: providing a circulatory flow of pasty product in the chamber which passes over the surface of the printing screen; and providing a flow of pasty product towards the printing screen which acts to force pasty product of the circulatory flow onto the printing screen and into apertures therein.

Preferably, the method further comprises the step of locally circulating pasty product in first and second circulation zones through which the circulatory flow is directed.

BRIEF DESCRIPTION OF THE DRAWINGS

A preferred embodiment of the present invention will now be described herein below by way of example only with reference to the accompanying drawings, in which.

DETAILED DESCRIPTION OF THE PREFERRED EMBODIMENTS

Figure 1:
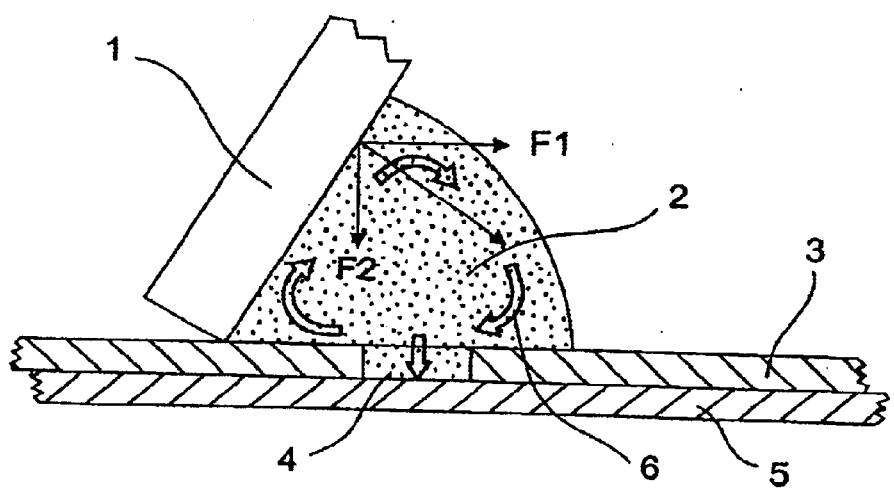
FIG. 1 illustrates a sectional view through a squeegee as employed in a traditional screen printing technique.
Figure 2:
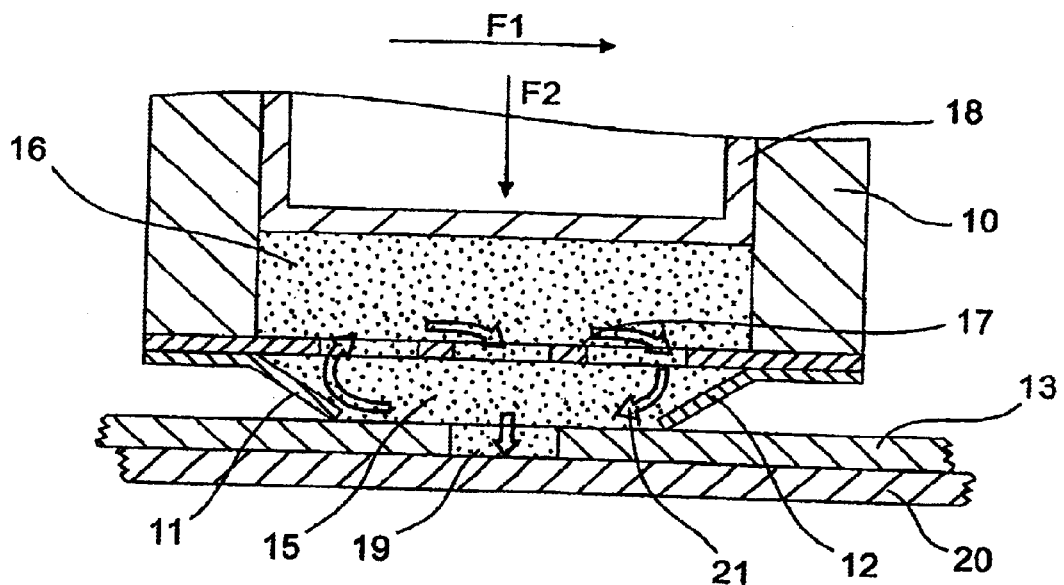
FIG. 2 illustrates a sectional view through a known screen printing head.
Figure 3A:
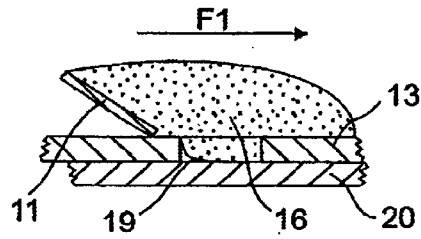
FIGS. 3a, 3b and 3c how the development of defects which can occur during screen printing using the printing head of FIG. 2.
Figure 3B:
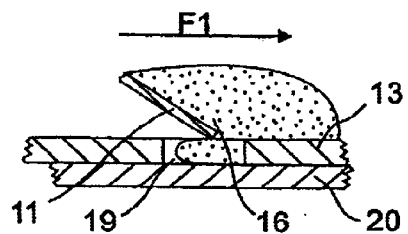
Figure 3C:
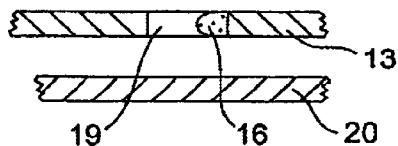
Figure 4:
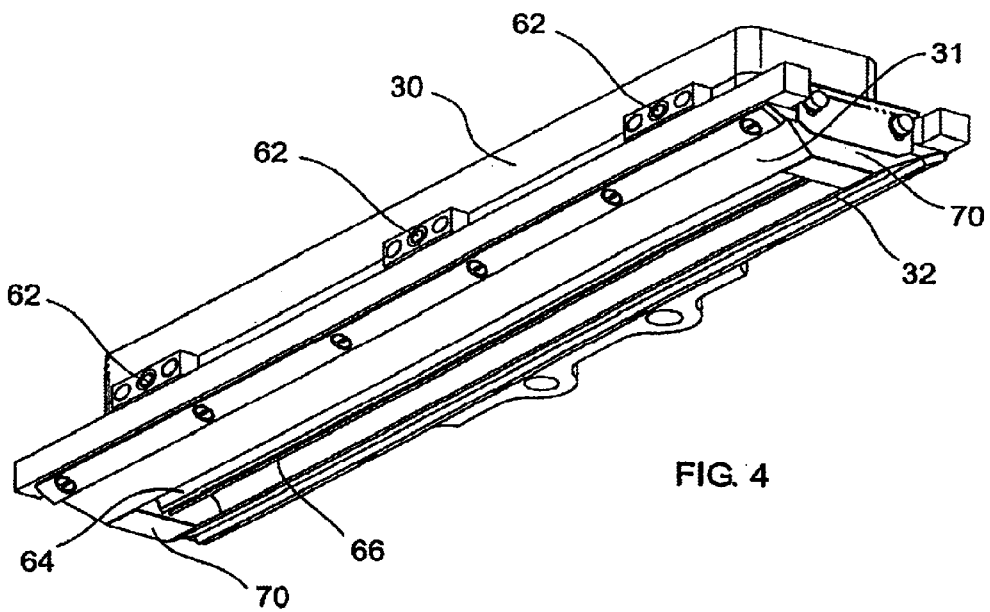
FIG. 4 illustrates a perspective view of a screen printing head in accordance with a preferred embodiment of the present invention.
Figure 5:
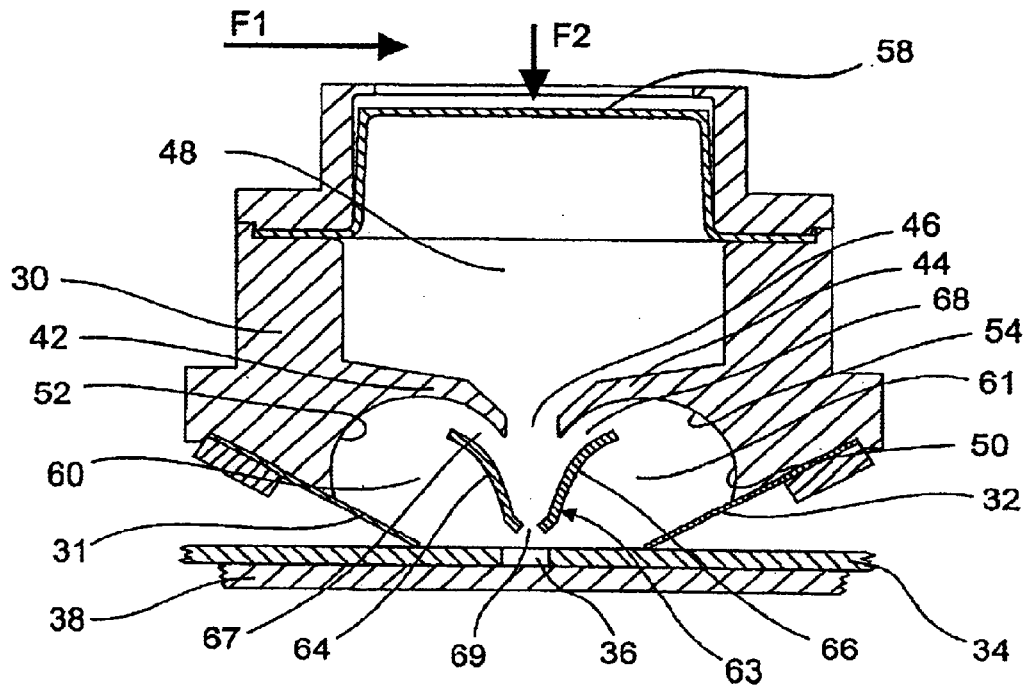
FIG. 5 illustrates a sectional view through the printing head of FIG. 4.
Figure 6:
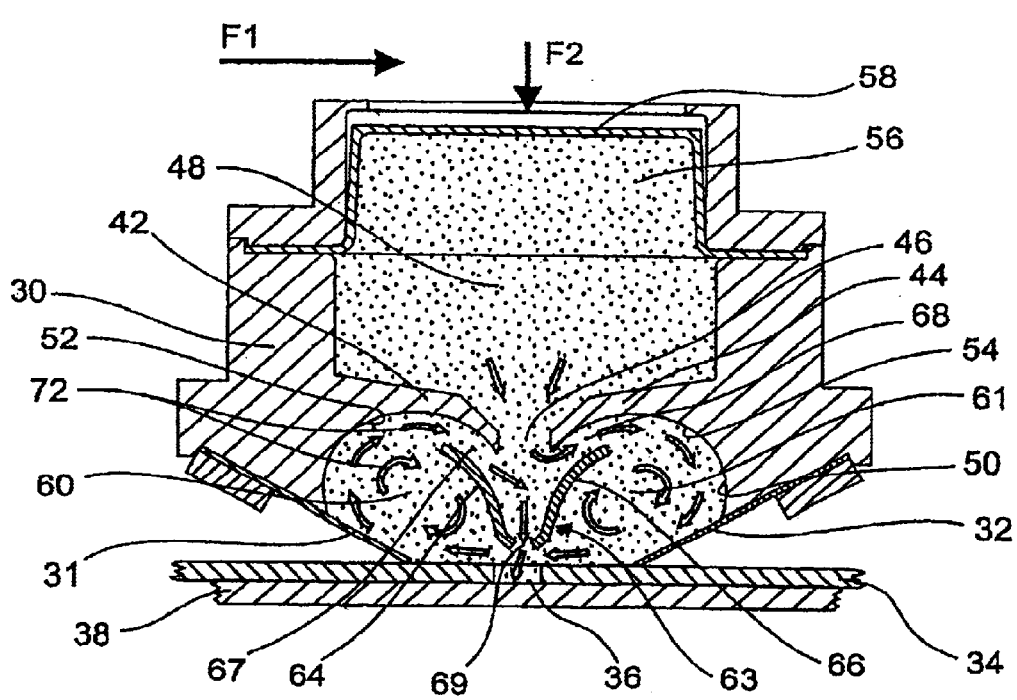
FIG. 6 illustrates a sectional view through the printing head of FIG. 4 when in operation.

The screen printing head comprises a main body 30, in this embodiment an elongate body, and first and second inwardly and downwardly directed wiper blades 31, 32 which are clamped to the main body 30 by respective clamping plates and screws. As illustrated in FIGS. 5 and 6, the wiper blades 31, 32 are in use maintained in contact with a stencil 34, which includes a plurality of apertures 36 and is located above a workpiece 38, in this embodiment a circuit board, onto which deposits of a pasty product are to be printed. In this embodiment the printing head is symmetrically arranged about the longitudinal axis thereof such as to be moveable bi-directionally.

The main body 30 includes first and second lobe members 42, 44, in this embodiment projections, between which an outlet opening 46, in this embodiment an elongate slot, is defined, and first and second chambers 48, 50 in fluid communication through the outlet opening 46. As will be described further herein below, each of first and second lobe members 42, 44 has an arcuate lower, roof surface 52, 54. One, the first, of the chambers 48 provides a reservoir for containing a pasty product 56 and is defined in part by a flexible diaphragm 58 which is in use acted upon to drive pasty product 56 under pressure into the other, second chamber 50. The other, second chamber 50 provides first and second circulation zones 60, 61 in and through which pasty product 56 is circulated is will be described further herein below. In this embodiment the main body 30 includes a plurality of ports 62 for charging the first chamber 48 with pasty product 56. In this embodiment the second chamber 50 is in use totally enclosed from the atmosphere to prevent drying out of the pasty product 56, with the stencil 34 in part enclosing the second chamber 50.

The printing head further comprises a flow director 63 disposed in the second chamber 50 adjacent the outlet opening 46. The flow director 63 comprises first and second vanes 64, 66 which each extend a distance parallel to the lower surface 52, 54 of respective ones of the first and second lobe members 42, 44 adjacent the outlet opening 46 such as to define passages 67, 68 therebetween and downwardly to define a nozzle 69, in this embodiment an elongate nozzle, therebetween which is spaced rearwardly from the plane defined by the lower edges of the wiper blades 31 32 such as to allow for a flow of the pasty product 56 therebeneath. With this configuration, the printing head is effectively divided into four sections as defined by the first chamber 48, the first and second circulation zones 60, 61 and the internal space of the flow director 63.

The printing head further comprises sealing members 70 at each of the ends thereof, which sealing members 70 are formed of a flexible material so as to conform to the wiper blades 31, 32 which deflect during printing.

In use, the printing head is brought into contact with the stencil 34 which is located above the underlying workpiece 38. A force F2 is applied to the flexible diaphragm 58 so as to pressurize the pasty product 56 in the first chamber 48 and force the same through the outlet opening 46 into the second chamber 50, the pasty product 56 being forced through the passages 67, 68 and the nozzle 69 into contact with the stencil 34. The printing head is then moved, under a horizontal force F1, across the stencil 34, which movement in conjunction with the adhesion of the pasty product 56 to the stencil 34, causes a circulatory flow of the pasty product 56 in the circulation zones 60, 61 as depicted by arrows 72. Pasty product 56 from the leading circulation zone, in this embodiment the second circulation zone 61, is drawn by adhesion to the stencil 34 between the nozzle 69 and the stencil 34, causing shear thinning of the pasty product 56 in this region. This flow of the pasty product 56 increases the pressure within the trailing circulation zone, in this embodiment the first circulation zone 60 and pasty product 56 is forced hack to the leading circulation zone 61 through the passages 67, 68, thereby further shear thinning the pasty product 56. At the same time, the action of the pasty product 56 introduced through the outlet opening 46 into the second chamber 50 is such as to apply a pressure through the nozzle 69 directly to the freshly shear-thinned pasty product 56 in the region below the nozzle 69, forcing the shear-thinned pasty product 56 into apertures 36 in the stencil 34.

The printing head of the present invention provides for better shear thinning, than any of the known printing heads, particularly in the critical region between the nozzle 69 and the stencil 34, and provides for much improved packing of pasty product 56 into the stencil apertures 36. The wiper blades 31, 32 are thus able to cleanly cut off the pasty product 56 across the lop of the stencil apertures 36, without leaving any voids in the stencil apertures 36. In this way, good contact is established between the pasty product 56 and the workpiece 38 over the full area of the stencil apertures 36, thereby ensuring good separation of the pasty product 56 from the stencil 34 on separating the stencil 34 from the work piece 38, and as a result high quality printing.

Finally, it will be understood that the present invention has been described in its preferred embodiment and can be modified in many different ways without departing from the scope of the invention as defined by the appended claims. For example, alternative designs for the first chamber 48 are clearly possible, such as an interchangeable cassette system, as disclosed, for example, in WO-A-98/16387. Also, the shape and size of the flow director 63, in particular the nozzle 69, and the first and second chambers 49, 50 can be altered from those of the illustrated embodiment. In particular, the widths of the outlet opening 46 and the nozzle 69, the width and length of the passages 67, 68, and the clearance between the lower edge of the nozzle 69 and the stencil 34, all have an effect on the operation of the printing head and can be altered to provide the desired balance between shear thinning and the maximum feed rate of the pasty product 56.

I claim:

1. A screen printing head for applying a pasty product to a printing screen, comprising:
    a main body;
    wiper blades attached to the main body for contacting a printing screen;
    a first chamber providing a reservoir for containing a supply of pasty product, the first chamber being defined at least in part by the main body and including at least one outlet opening through which pasty product in use is forced under pressure;
    a second chamber in fluid communication with the at least one outlet opening, the second chamber being defined in part by the main body and the wiper blades and being in use in communication with the printing screen; and
    a flow director disposed in the second chamber and configured to cause a first, circulatory flow of pasty product contained therein which passes over the surface of the printing screen, and a second flow of pasty product towards the printing screen which acts to force pasty product of the first, circulatory flow towards the printing screen and into apertures therein.

2. The printing head of claim 1, wherein the at least one outlet opening comprises an elongate slot.

3. The printing head of claim 1, wherein the flow director is further configured such as to define first and second circulation zones in which pasty product is locally circulated and through which the first, circulatory flow is directed.

4. The printing head of claim 1, wherein the flow director comprises vanes, with the first, circulatory flow in use passing beneath lower edges of the vanes.

5. The printing head of claim 4, comprising first and second vanes disposed on opposed sides of the at least one outlet opening, with the lower edges of the vanes defining a nozzle directed towards the printing screen.

6. The printing head of claim 5, wherein the nozzle is an elongate nozzle.

7. The printing head of claim 1, wherein the main body includes first and second lobe members which in part define the second chamber, the lobe members being disposed above respective ones of the wiper blades and having arcuate lower surfaces so as to promote the first, circulatory flow.

8. The printing head of claim 1, wherein the main body includes one or more ports through which the first chamber can be charged with pasty product.

9. The printing head of claim 1, wherein the main body includes a replaceable cassette which defines at least in part the first chamber, the first chamber being charged by replacement of the cassette.

10. The printing head of claim 1, wherein the wiper blades comprise flexible wiper blades.

11. A screen printing apparatus comprising the printing head of claim 1.

12. A method of screen printing using a screen printing head, the screen printing head including a chamber in communication with a printing screen and a flow director disposed in the chamber and configured to cause a first, circulatory flow of pasty product contained therein which passes over the surface of the printing screen, and a second flow of pasty product towards the printing screen which acts to force pasty product of the first, circulatory flow towards the printing screen and into apertures therein, the method comprising the steps of:
    providing the first, circulatory flow of pasty product in the chamber which passes over the surface of the printing screen; and
    providing the second flow of pasty product towards the printing screen which acts to force pasty product of the first, circulatory flow onto the printing screen and into apertures therein.

13. The method of claim 12, further comprising the step of:
    locally circulating pasty product in first and second circulation zones of the chamber through which the first, circulatory flow is directed.

* * * * *